US008493087B2

(12) United States Patent
Cho et al.

(10) Patent No.: US 8,493,087 B2
(45) Date of Patent: Jul. 23, 2013

(54) PROBE CARD, AND APPARATUS AND METHOD FOR TESTING SEMICONDUCTOR DEVICE USING THE PROBE CARD

(75) Inventors: Chang-Hyun Cho, Suwon-si (KR); Joonyeon Kim, Seongnam-si (KR); Sang-Gu Kang, Hwaseong-si (KR); Sanghoon Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 575 days.

(21) Appl. No.: 12/654,235

(22) Filed: Dec. 15, 2009

(65) Prior Publication Data

US 2010/0148811 A1 Jun. 17, 2010

(30) Foreign Application Priority Data

Dec. 16, 2008 (KR) ........................ 10-2008-0127950

(51) Int. Cl.
*G01R 31/00* (2006.01)

(52) U.S. Cl.
USPC ................................ 324/756.03; 324/754.07

(58) Field of Classification Search
USPC ........................................ 324/754.07, 756.03
See application file for complete search history.

(56) References Cited

U.S. PATENT DOCUMENTS 5,818,249 A * 10/1998 Momohara ............. 324/756.03
6,651,325 B2 * 11/2003 Lee et al. ........................ 29/846
6,774,657 B2 8/2004 Hashimoto et al.
6,998,858 B2 * 2/2006 Sawada et al. ........... 324/750.22
7,081,766 B2 * 7/2006 Satou et al. .............. 324/754.07
7,285,966 B2 * 10/2007 Lee et al. ................. 324/754.07
7,772,863 B2 * 8/2010 Breinlinger et al. ..... 324/756.03
2005/0275418 A1 * 12/2005 Chong et al. .................. 324/758
2006/0290367 A1 * 12/2006 Hobbs et al. .................. 324/763
2007/0096761 A1 * 5/2007 Maruyama et al. ........... 324/765
2007/0290705 A1 * 12/2007 Eldridge et al. .............. 324/765
2009/0045827 A1 * 2/2009 Gangoso et al. .............. 324/754
2009/0140760 A1 * 6/2009 Narita et al. .................. 324/762
2010/0039133 A1 * 2/2010 McFarland et al. ........... 324/758

FOREIGN PATENT DOCUMENTS

KR 20-1999-0024877 A 7/1999
KR 10-2001-0110979 A 12/2001
KR 20-0416956 Y1 5/2006
KR 10-2006-0104366 A 10/2006
KR 10-2006-0127689 A 12/2006
KR 10-2007-0042612 A 4/2007

* cited by examiner

*Primary Examiner* — Arleen M Vazquez
(74) *Attorney, Agent, or Firm* — Lee & Morse, P.C.

(57) ABSTRACT

A probe card transmitting electrical test signals between a tester and a semiconductor device includes a main circuit board configured to receive and transmit electrical signals from the tester, an interface unit electrically connected to the main circuit board, the interface unit including a signal line and a signal connection terminal, and at least one probe unit connected to the interface unit, the probe unit being detachable and including a plurality of probe needles arranged in a pattern corresponding to a pattern of electrode pads of the semiconductor device.

20 Claims, 9 Drawing Sheets

PROBE CARD, AND APPARATUS AND METHOD FOR TESTING SEMICONDUCTOR DEVICE USING THE PROBE CARD

BACKGROUND

1. Field

Example embodiments relate to apparatuses and methods for testing electrical characteristics of semiconductor devices. More particularly, example embodiments relate to a probe card transmitting an electrical signal for a test between a tester and a semiconductor device, and an apparatus and a method for testing a semiconductor device using the probe card.

2. Description of the Related Art

Generally, a semiconductor device may be manufactured by a fabrication process forming a pattern on a wafer and an assembly process assembling the wafer on which the pattern is formed into a unit chip. An electric die sorting (EDS) process for testing an electrical characteristic of the unit chip, i.e., a unit semiconductor device on the wafer, may be performed between the fabrication process and the assembly process.

The EDS process is performed to identify malfunctioning unit chips among a plurality of unit semiconductor devices on a wafer. The EDS process is performed using a test apparatus which applies an electric signal to the plurality of unit semiconductor devices on a wafer and identifying malfunctioning chips by a signal checked from the applied electric signal.

The test apparatus may include a probe card with probe needles which are in contact with electrode pads of the unit semiconductor devices. The test apparatus may apply an electric signal to the electrode pads of the unit semiconductor devices to test electrical characteristics thereof.

SUMMARY

Embodiments are directed to a probe card, an apparatus including the same, and a method for testing a semiconductor device using the probe card, which substantially overcome one or more of the problems due to the limitations and disadvantages of the related art.

It is therefore a feature of an embodiment to provide a probe card having a detachable probe unit with probe needles corresponding to electrode pads of a semiconductor device to be tested.

It is another feature of an embodiment to provide a test apparatus with a probe card having a detachable probe unit with probe needles corresponding to electrode pads of a semiconductor device to be tested.

It is yet another feature of an embodiment to provide a method of testing electrical characteristics of a semiconductor device by using a detachable probe unit with probe needles corresponding to electrode pads of a semiconductor device to be tested.

At least one of the above and other features and advantages may be realized by providing a probe card transmitting an electric signal for a test of a semiconductor device between a tester and the semiconductor device, including a main circuit board receiving an electric signal from the tester and transmitting an electric signal to the tester, an interface unit electrically connected to the main circuit board, the interface unit including a signal line through which the electric signal flows and a signal connection terminal, and a probe unit which is combined with the interface unit with a possibility of detaching from and attaching to the interface unit and to which probe needles arranged in a different structure are provided according to the semiconductor device to be tested.

At least one of the above and other features and advantages may also be realized by providing a test apparatus testing an electrical characteristic of a semiconductor device, including a substrate support member on which a substrate is placed, a tester testing an electrical characteristic of a semiconductor device formed in the substrate placed on the substrate support member, a probe card transmitting an electric signal for a test of the semiconductor device between the tester and the semiconductor device formed in the substrate, wherein the probe card includes a main circuit board receiving the electric signal from the tester and transmitting the electric signal to the tester, an interface unit electrically connected to the main circuit board, the interface unit including a standard general purpose signal line through which the electric signal flows and a standard general purpose signal connection terminal, and a probe unit which is combined with the interface unit with a possibility of detaching from and attaching to the interface unit and to which probe needles arranged in a different structure are provided according to the semiconductor device to be tested.

The interface unit may include an interface board having a plate shape and disposed below the main circuit board, the interface board including first connection terminals on a top surface thereof and second connection terminals on a bottom surface thereof, the first and second connection terminals being electrically connected to each other, and an interposer electrically connecting the main circuit board and the first connection terminals. The first connection terminals may be arranged in a lattice shape on the top surface of the interface board and the second connection terminals may be symmetrically arranged along facing edges of the bottom surface of the interface board. The probe unit may include a substrate with a plurality of holes therethrough, the holes being filled with a conductive material, and the probe needles being on a bottom surface of the substrate and electrically connected to the conductive material in corresponding holes of the substrate. The holes of the substrate may be arranged at positions corresponding to an arrangement of the second connection terminals. The holes of the substrate may be arranged at positions corresponding to an arrangement of the probe needles. The substrate may be attached to the interface board via solder balls, the solder balls being positioned between the second connection terminals and the conductive material in the holes. The probe card may further include a redistributed interconnection metal layer on the substrate, the redistributed interconnection metal layer electrically connecting the probe needles and the conductive material in the holes. The at least one probe unit may include a plurality of probe units corresponding to a plurality of semiconductor devices to be tested simultaneously. The probe card may further include a reinforcement member contacting a top surface and a bottom surface of the main circuit board, the reinforcement member being configured to prevent deformation of the main circuit board, and an interface board support member on the reinforcement member, the interface board support member supporting the bottom surface of the interface board. The at least one detachable probe unit may be attached to the interface unit via solder balls, the interface unit being stationary within the probe card.

At least one of the above and other features and advantages may also be realized by providing a test method for testing an electrical characteristic of a semiconductor device by contacting electrode pads of the semiconductor device with probe needles provided to a the probe unit of a probe card, the probe unit being adjusted according to the semiconductor device to be tested, such that the probe needles are arranged in a pattern corresponding to a pattern of the electrode pads of the semiconductor device to be tested; and transmitting electrical signals between a tester and the semiconductor device via the probe card, the tester being electrically connected to the main circuit board. Adjusting the probe unit may include detaching from an interface board of the interface unit a first probe unit with a first arrangement of probe needles, and attaching to the interface board a second probe unit with a second arrangement of probe needles, the first and second arrangements of probe needles being different from each other. Adjusting the probe unit may include detaching and attaching the probe unit, while the interface unit and main circuit board remain stationary. Adjusting the probe unit may include attaching the probe unit to the interface board via a reflow process of solder balls.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
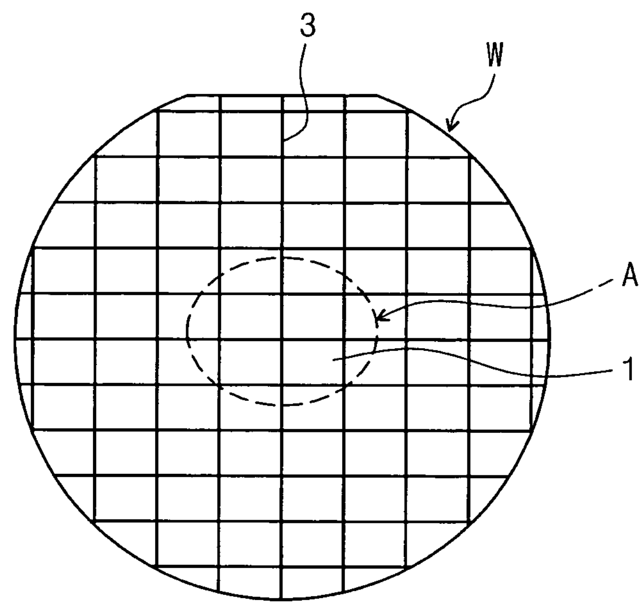
FIG. 1 illustrates a schematic representation of a wafer with a plurality of unit semiconductor devices.

Korean Patent Application No. 10-2008-0127950, filed on Dec. 16, 2008, in the Korean Intellectual Property Office, and entitled: "Probe Card, and Apparatus and Method for Testing Semiconductor Device Using the Probe Card," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers and/or elements may also be present. In addition, it will also be understood that when a layer or element is referred to as being "between" two layers and/or elements, it can be the only layer/element between the two layers and/or elements, or one or more intervening layers and/or elements may also be present. Like reference numerals refer to like elements throughout.

Figure 2:
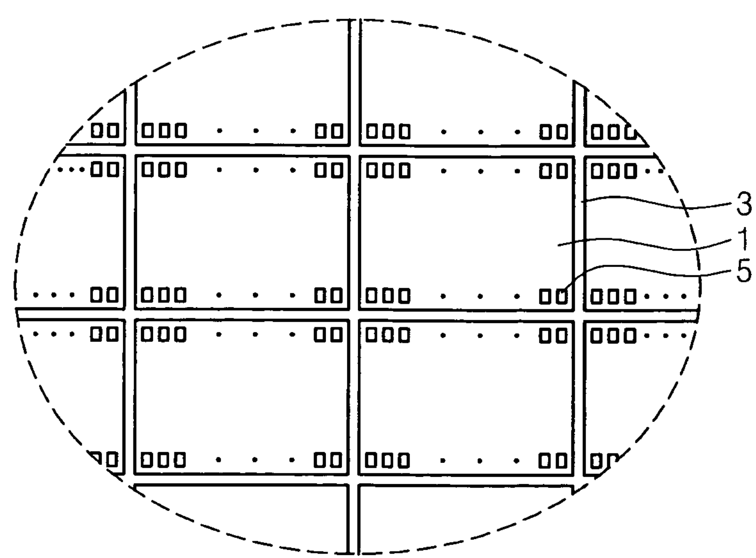
FIG. 2 illustrates an enlarged "A" region of FIG. 1.

FIG. 1 illustrates a wafer on which a semiconductor device is formed. FIG. 2 illustrates an enlarged "A" region of FIG. 1.

Referring to FIGS. 1 and 2, a plurality of unit semiconductor devices 1 may be formed on a wafer (W) through a fabrication process. The wafer (W) may be divided along scribe lines 3 into separate unit semiconductor devices 1. A plurality of unit semiconductor devices 1 may be manufactured as unit chips through an assembly process.

An electric die sorting (EDS) process for testing electrical characteristics of the unit semiconductor devices 1 formed on the wafer (W) may be performed between the fabrication process and the assembly process. The EDS process may apply electrical signals to electrode pads 5 provided along, e.g., peripheral, regions of the unit semiconductor devices 1 formed on the wafer (W), so malfunctioning unit semiconductor devices 1 may be identified by signals checked from the applied electric signals.

Hereinafter, a test apparatus of semiconductor devices used in performing an EDS process according to example embodiments will be described.

Figure 3:
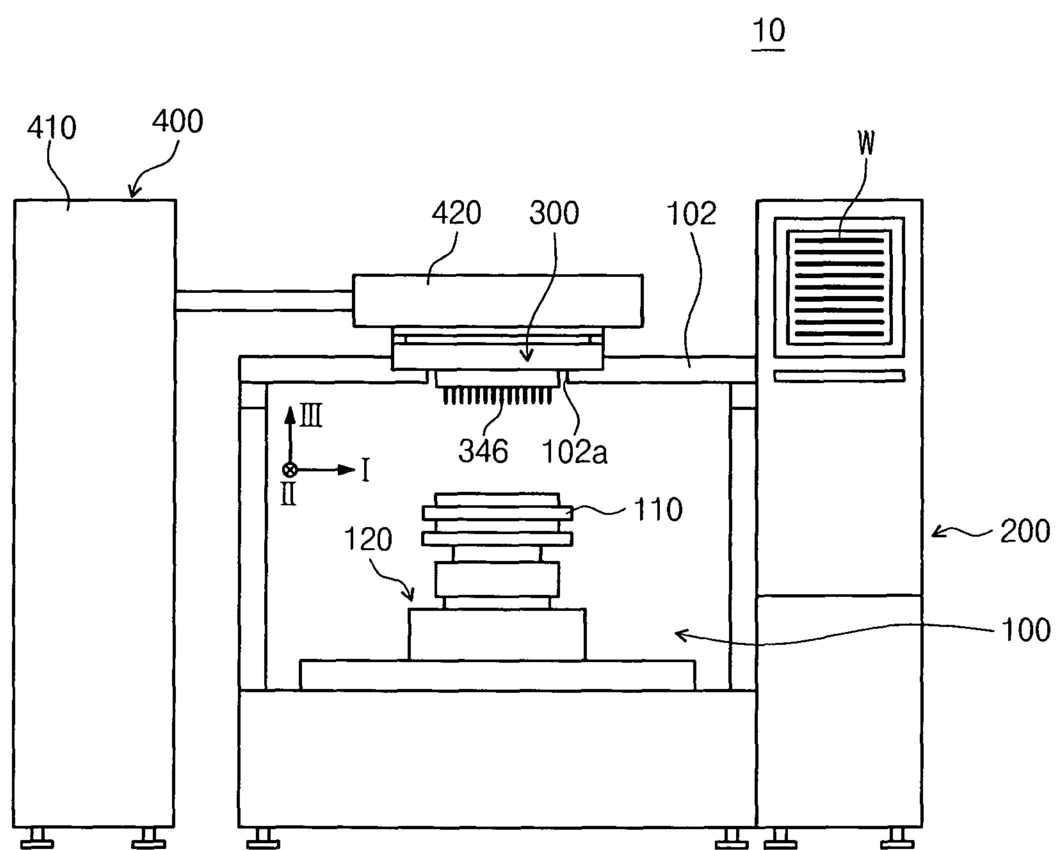
FIG. 3 illustrates a schematic representation of a test apparatus according to example embodiments.

FIG. 3 illustrates a semiconductor device test apparatus 10 according to example embodiments. Referring to FIG. 3, the semiconductor device test apparatus 10 may include a probe room 100, a load room 200, a probe card 300, and a tester 400.

The probe room 100 may provide a space in which the EDS process for testing an electrical characteristic of the semiconductor device is performed. A load room 200 may be adjacent to a first side of the probe room 100. The load room 200 may accommodate at least one wafer (W), e.g., a plurality of wafers (W), to be tested. The load room 200 may include a mechanism for transferring the wafer (W) to the probe room 100 for testing.

The probe card 300 may be installed in an opening 102*a* formed in an upper wall 102 of the probe room 100. A substrate support member 110 may be disposed inside the probe room 100 so as to face the probe card 300. Therefore, a wafer (W) transferred from the load room 200 may be placed on the substrate support member 110 to face the probe card 300.

The substrate support member 110 may be installed on a transfer member 120. The transfer member 120 may linearly transfer, e.g., move, the substrate support member 110 in a horizontal direction, e.g., along any direction in a plane defined by directions I and II, and in a vertical direction, e.g., along direction III. The transfer member 120 may rotate the substrate support member 110 using a central axis perpendicular to a plane of the wafer (W) as the axis of rotation. For example, the horizontal direction may refer to any direction in a plane where the unit semiconductor devices 1 are arranged, and the vertical direction may refer to a direction perpendicular to the plane of the wafer (W).

The substrate support member 110 may be moved, e.g., linearly, in the horizontal direction or rotated by the transfer member 120, so an arrangement direction of the electrode pads 5 of a unit semiconductor device 1 formed on the wafer (W) may be aligned with corresponding probe needles 346 of the probe card 300. The substrate support member 110 may be moved in the vertical direction by the transfer member 120, so the electrode pads 5 of the unit semiconductor device 1 formed on the wafer (W) may physically contact the probe needles 346 of the probe card 300. The substrate support member 110 may be repeatedly moved in the vertical direction and the horizontal direction, so the EDS process may be consecutively performed along an arrangement direction of the unit semiconductor devices 1, e.g., on all the unit semiconductor devices 1, formed on the wafer (W).

The tester 400 may include a test body 410 disposed at a second side of the probe room 100, i.e., on an opposite side of the probe room 100 with respect to the load room 200, and a test head 420 connected to the test body 410. The test head 420 may be moved by a driver (not shown) included in the test body 410 to be disposed on an upper portion of the probe card 300 and to be electrically connected to the probe card 300. The test body 410 may apply an electric signal for testing a semiconductor device to the probe card 300 through the test head 420, and then may receive a check signal corresponding to the applied electric signal from the probe card 300 to identify malfunctioning semiconductor devices.

Figure 4:
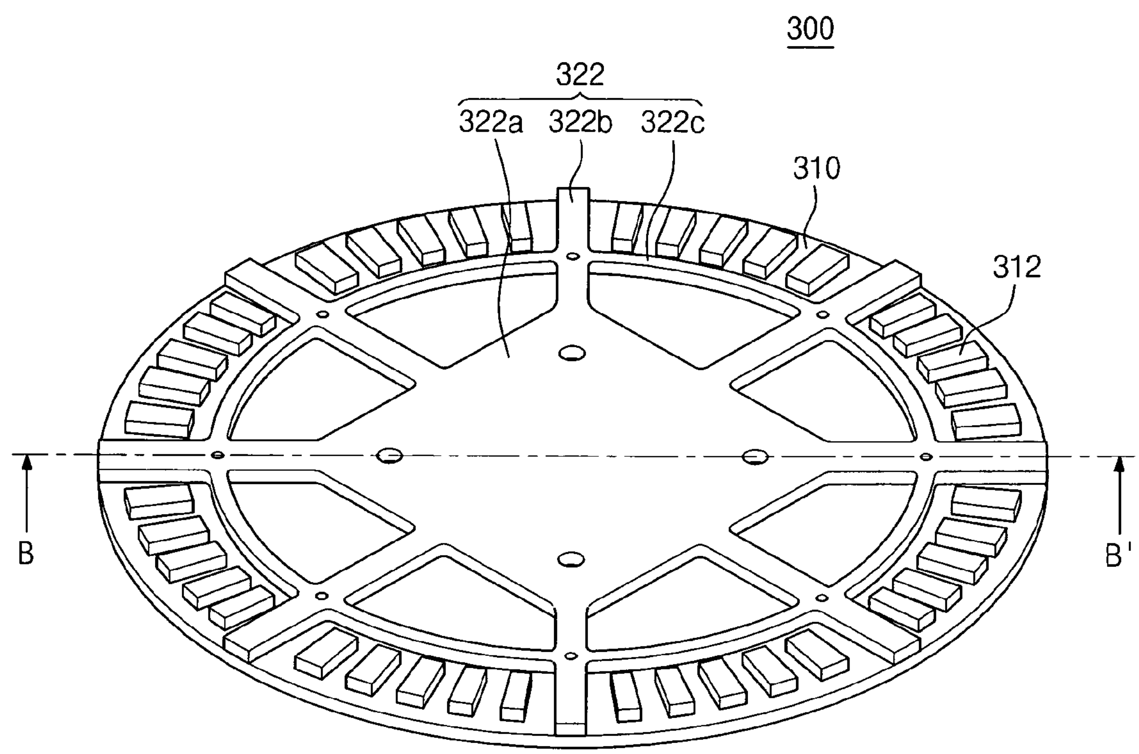
FIG. 4 illustrates a perspective enlarged view of a probe card according to example embodiments.
Figure 5:
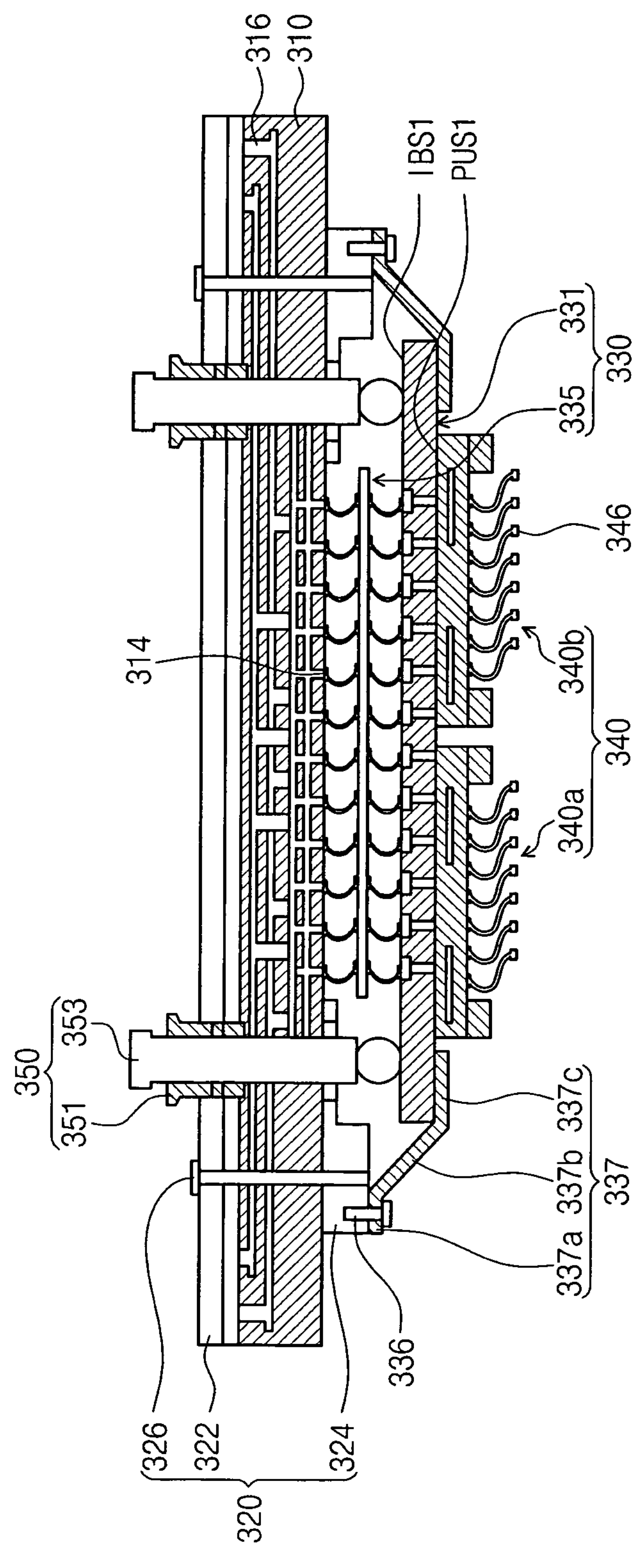
FIG. 5 illustrates a cross sectional view taken along line B-B' of FIG. 4.

FIG. 4 illustrates an enlarged perspective view of the probe card 300. FIG. 5 illustrates a cross sectional view taken along line B-B' of FIG. 4. Referring to FIGS. 3-5, the probe card 300 may transmit electrical test signals between the tester 400 and the unit semiconductor devices 1 on the wafer (W), which is placed on the substrate support member 110, for testing electrical characteristics of the unit semiconductor devices 1.

Referring to FIG. 4, the probe card 300 may include a main circuit board 310, e.g., having a round plate shape, and connectors 312 on a top surface of the main circuit board 310. For example, the connectors 312 may be disposed along an edge of the main circuit board 310, e.g., along an entire perimeter of the main circuit board 310. As illustrated in FIG. 5, terminals 314 may be formed on a bottom surface, i.e., a surface opposite the top surface, of the main circuit board 310, e.g., in a center portion of the main circuit board 310. The connectors 312 may be electrically connected to the test head 420, and may be electrically connected to the terminals 314 by signal interconnections 316 provided inside the main circuit board 310.

As illustrated in FIG. 5, the probe card 300 may further include a reinforcement member 320 for preventing bending or twisting of the main circuit board 310. The reinforcement member 320 may include an upper reinforcement plate 322, a lower reinforcement plate 324, and a screw 326. As illustrated in FIG. 4, the upper reinforcement plate 322 may include a center portion **322*a*, e.g., having a square shape, overlapping a center of the probe card 300. A plurality of radial shape portions 322*b* may extend in a radial direction away from the center portion 322*a*, e.g., distances between the radial shape portions 322*b* may be adjusted to minimize bending. A ring shape portion 322*c* may surround the center portion 322*a* at a predetermined distance therefrom, and may connect the plurality of the radial shape portions 322*b*, e.g., connect centers of the radial shape portions 322*b*. The lower reinforcement plate 324** may have a plate shape or a donut shape.

As illustrated in FIG. 5, the upper reinforcement plate 322 may be in contact with a top surface of the main circuit board 310, and the lower reinforcement plate 324 may be in contact with a bottom surface of the main circuit board 310. Holes may be formed through the upper reinforcement plate 322, e.g., through the ring shape portion **322*c*, the lower reinforcement plate 324, and the main circuit board 310. The screws 326 may be inserted through the formed holes, e.g., through a peripheral portion of the main circuit board 310. The upper reinforcement plate 322 and the lower reinforcement plate 324 may be pressed toward each other by tightening the screws 326, so the top surface and the bottom surface of the main circuit board 310 may be uniformly pressurized by the upper reinforcement plate 322 and the lower reinforcement plate 324. Thus, bending or twisting of the main circuit board 310** may be prevented or substantially minimized.

An interface unit 330 may be provided under the main circuit board 310, e.g., the main circuit board 310 may be between the upper reinforcement plate 322 and the interface unit 330. The interface unit 330 may be a medium transmitting electric signals between the main circuit board 310 and a probe unit 340. The interface unit 330 may include an interface board 331 and an interposer 335. The interface board 331 may have a plate shape, and may be disposed below the main circuit board 310, e.g., the main circuit board 310 may be between the upper reinforcement plate 322 and the interface board 331. The interposer 335 may be disposed between the main circuit board 310 and the interface board 331, and may electrically connect the main circuit board 310 and the interface board 331.

The interface board 331 may be supported by an interface board support member 337. The interface board support member 337 may have, e.g., a crank shape. More specifically, the interface board support member 337 may include a first horizontal portion **337*a* in contact with the lower reinforcement plate 324, a second horizontal portion 337*c*, e.g., extending horizontally in parallel to the first horizontal portion 337*a*, in contact with the interface board 331, and an inclination portion 337*b* extending in a downwardly inclined direction from the first horizontal portion 337*a* to the second horizontal portion 337*c*. The first horizontal portion 337*a* may be combined with the lower reinforcement plate 324 by a screw 336. An edge portion of a bottom surface of the interface board 331 may be supported by the second horizontal portion 337*c* of the interface board support member 337**.

At least one probe unit 340, e.g., first and second probe units **340*a* and 340*b*, may be attached to the bottom surface of the interface board 331 supported by the interface board support member 337. The probe unit 340 may be a detachable unit, e.g., completely separable, from the interface unit 330. For example, one probe unit 340 may be disconnected from the interface unit 330 and replaced with another probe unit 340 in accordance with a semiconductor device being tested, e.g., according to an arrangement of probe needles 346 therein, as will be discussed in more detail below with reference to FIGS. 6-12. If the probe unit 340 includes a plurality of probe units, e.g., first and second probe units as 340*a* and 340*b*, each of the plurality of probe units 340** may be independently detachable.

The probe units 340 may be adjusted to maintain a horizontal state, e.g., an upper surface (PUS1) of the probe unit 340 (FIG. 6) may be substantially parallel to a bottom surface (IBS2) of the interface board 331 (FIG. 6), so the probe needles 346 in the probe unit 340 may be uniformly in contact with unit semiconductor devices to be tested. As the horizontal state of the probe unit 340 is determined according to a horizontal state of the interface board 331, the horizontal state of the interface board 331 may be controlled by a horizontal controller 350.

The horizontal controller 350 may include coupling members 351 and axis members 353. The coupling member 351 may be a hollow member in which a female screw may be formed, and may be positioned in the upper reinforcement plate 322 of the reinforcement member 320. Holes may be formed through the main circuit board 310 and through the lower reinforcement plate 324, and may be aligned with the hollow portion of the coupling member 351 to form a trench. The axis member 353 may be combined with the coupling member 351 using a screw combination method, e.g., rotation of the axis member 353 may move the axis member 353 along a lengthwise direction of the trench to penetrate the holes formed through the main circuit board 310 and the lower reinforcement plate 324. When the axis member 353 is completely inserted through the trench, an end portion of the axis member 353 may contact a top surface of the interface board 331. The horizontal state of the interface board 331 may be determined by a number of rotations of the axis member 353, e.g., after contact between the interface board 331 and the end portion of the axis member 353.

Figure 6:
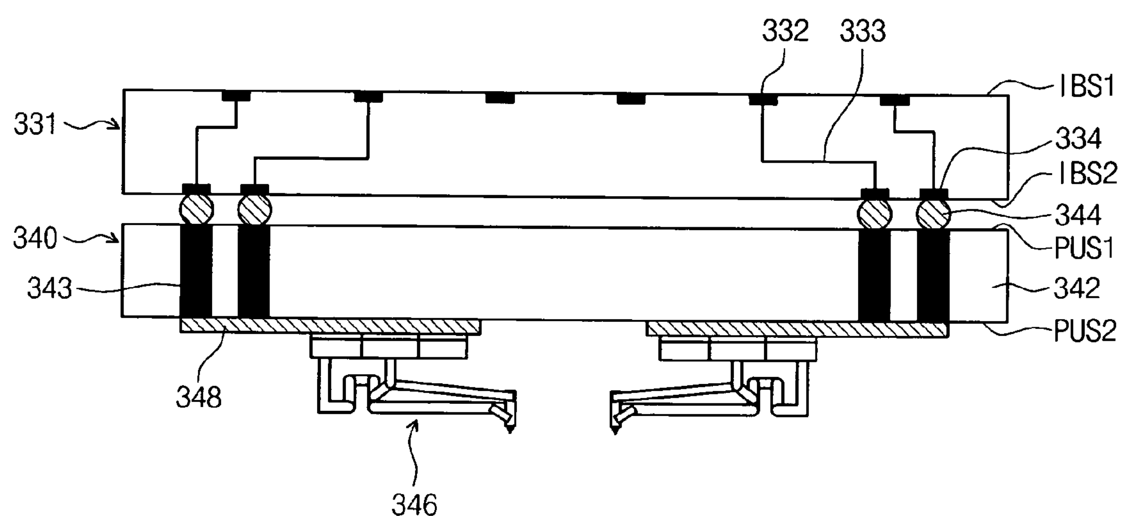
FIG. 6 illustrates a schematic side view of a connection between an interface board and a probe unit of FIG. 5.
Figure 7:
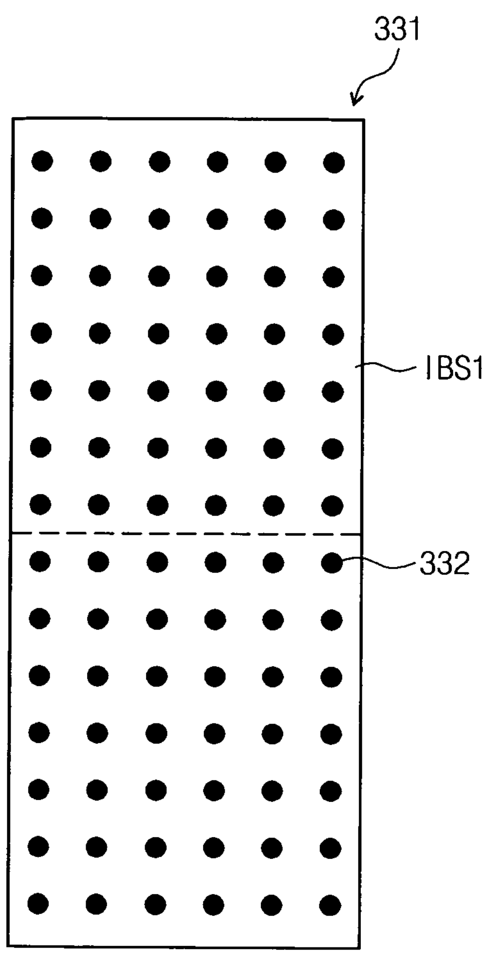
FIG. 7 illustrates an arrangement of terminal connections on a top surface of the interface board of FIG. 6.
Figure 8:
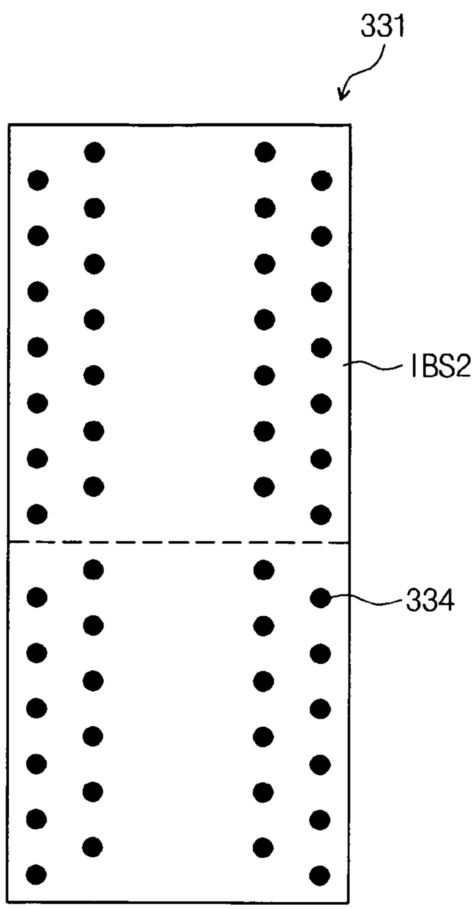
FIG. 8 illustrates an arrangement of terminal connections on a bottom surface of the interface board of FIG. 6.
Figure 9:
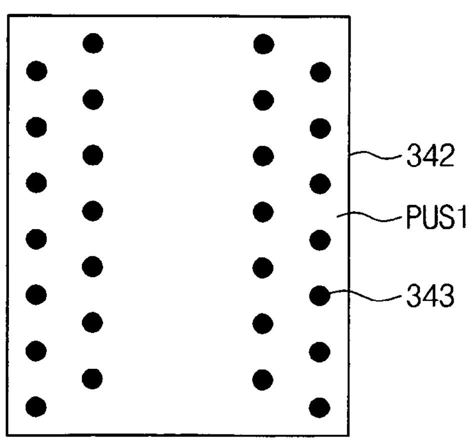
FIG. 9 illustrates an arrangement of holes through the substrate of the probe unit of FIG. 6.
Figure 10:
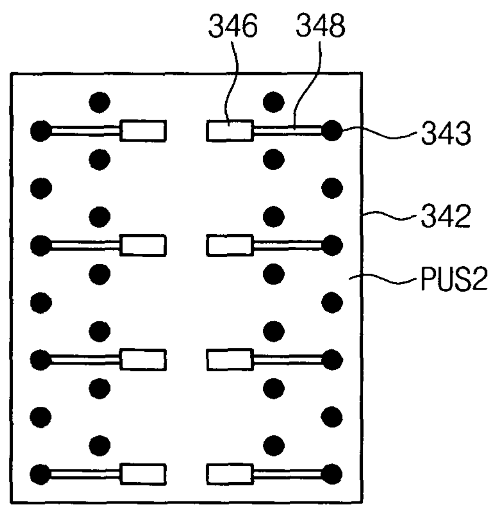
FIG. 10 illustrates a relative arrangement of holes and probe needles on a bottom plan view of the probe unit of FIG. 6.

FIG. 6 illustrates a side view of the interface board 331 and probe units 340. FIGS. 7 and 8 illustrate a top surface and a bottom surface of the interface board 331, respectively. FIG. 9 illustrates a top surface of a substrate of the probe units 340. FIG. 10 illustrates a bottom plan view of the probe units 340.

Referring to FIG. 6, the interface board 331 may include first connection terminals 332 on a top surface (IBS1) of the interface board 331, i.e., a surface of the interface board 331 facing the main circuit board 310, and second connection terminals 334 on the bottom surface (IBS2) of the interface board 331, i.e., a surface of the interface board 331 facing the probe units 340. The first connection terminals 322 may be electrically connected to the interposer 335. The first and second connection terminals 332 and 334 may be electrically connected to each other by signal lines 333 formed inside the interface board 331.

The first and second connection terminals 332 and 334 may be formed in any suitable pattern, e.g., in a line pattern, in a lattice pattern, etc. For example, as illustrated in FIG. 7, the first connection terminals 332 may be arranged in a lattice shape on the, e.g., substantially entire, top surface (IBS1) of the interface board 331. In another example, as illustrated in FIG. 8, the second connection terminals 334 may be symmetrically formed on facing edges of the bottom surface (IBS2) of the interface board 331, e.g., the second connection terminals 334 may form two lines along each longitudinal edge of the bottom surface (IBS2) of the interface board 331. The arrangements of the first and second connection terminals 332 and 334 in FIGS. 7 and 8 are only illustrations, and the first and second connection terminals 332 and 334 may be arranged in various structures.

The interface board 331 may be used in a general-purpose. That is, the first connection terminals 332, the second connection terminals 334, and the signal lines 333 may be provided according to a predetermined standard regardless of an arrangement of the probe needles 346 of the probe unit 340.

Figure 11:
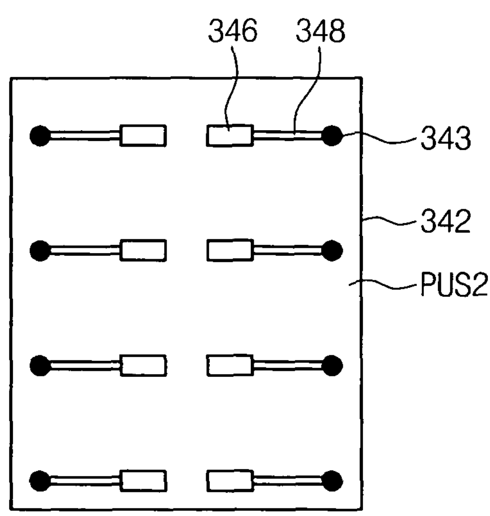
FIG. 11 illustrates a relative arrangement of holes and probe needles on a bottom plan view of a probe unit according to other example embodiments.

Referring back to FIG. 6, at least one probe unit 340 may be attached to the bottom surface (IBS2) of the interface board 331. For example, a plurality of probe units 340 may be provided, as illustrated in FIG. 5, so that tests for a plurality of unit semiconductor devices may be performed at the same time. The probe unit 340 may include a substrate 342 and probe needles 346. The substrate 342 may have a shape corresponding to the interface board 331, and may overlap at least a portion of the bottom surface (IBS2) of the interface board 331. The substrate 342 may include top and bottom surfaces (PUS1) and (PUS2) opposite each other, and a plurality of holes may be formed through the substrate 342 to extend between the top and bottom surfaces (PUS1) and (PUS2). The holes 343 may be filled, e.g., completely filled, with a conductive material to facilitate connection between the second connection terminals 344 of the interface board 331 and the probe needles 346. The holes 343 may be formed in any suitable arrangement. For example, as illustrated in FIGS. 9 and 10, the holes 343 may correspond to an arrangement of the second connection terminals 334 on the bottom surface (IBS2) of the interface board 331 (FIG. 8), so all the holes 343 and second connection terminals 334 may overlap each other. In other words, as illustrated in FIGS. 9 and 10, the holes 343 may be formed at all the positions on the substrate 342 corresponding to the second connection terminals 334 of the interface board 331. Alternatively, as illustrated in FIG. 11, the holes 343 may be formed only at specific positions of the substrate 342 corresponding to an arrangement of the probe needles 346, so some of the second connection terminals 334 may not face, e.g., may not be connected, the holes 343.

The substrate 342 of the probe card 340 may be attached to the interface board 331 by any suitable process, e.g., a process maintaining the substrate 342 detachable from the interface board 331. For example, as illustrated in FIG. 6, the substrate 342 and interface board 331 may be attached via a reflow process of a solder ball 344 placed between the conductive material filling the holes 343 and the second connection terminals 334 of the interface board 331. In another example, the substrate 342 may be attached to the interface board 331 using other methods, e.g., a rubber type of a ball contactor. For example, when the holes 343 are arranged as illustrated in FIG. 10, solder balls 344 may be placed between all the second connection terminals 334 of the interface board 331 and conductive material in all the holes 343 of the substrate 342 corresponding to the second connection terminals 334. In another example, when the holes 343 are arranged as illustrated in FIG. 11, the solder balls 344 may be placed between conductive material in all the holes 343 and only corresponding second connection terminals 334 on the substrate 342.

The probe needles 346 may be in, e.g., physical, contact with electrode pads of a unit semiconductor device to be tested. The probe needles 346 may be on the bottom surface (PUS2) of the substrate 342, and may be electrically connected to the conductive material filling the holes 343 of the substrate 342. According to an embodiment, the probe needles 346 may be in contact with a redistributed interconnection metal layer 348 formed on the substrate 342, so that the probe needles 346 may be electrically connected to the conductive material filling the holes 343 of the substrate 342 via the redistributed interconnection metal layer 348.

Figure 12:
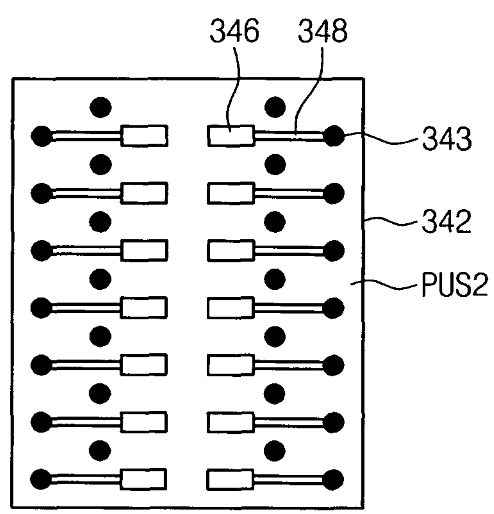
FIG. 12 illustrates a relative arrangement of holes and probe needles on a bottom plan view of the probe unit according to other example embodiments.

The probe needles 346 may have different arrangements to correspond to different arrangements of electrode pads in semiconductor devices to be tested. For example, as illustrated in FIG. 10, the probe unit 340 may have a first number of probe needles 346, e.g., eight probe needles 346, arranged in a first arrangement, e.g., having two holes 343 between adjacent probe needles 346. In another example, as illustrated in FIG. 12, the probe unit 340 may have a second number of probe needles 346, e.g., fourteen probe needles 346, arranged in a second arrangement, e.g., having one hole 343 between adjacent probe needles 346. Therefore, the detachable probe unit 340 may be replaced and adjusted in accordance with the arrangement of probe needles therein in order to correspond to the semiconductor device to be tested.

The probe unit 340 according to example embodiments may be attached to the interface board 331 by a reflow process of the solder ball 344, so the probe unit 340 may be easily attached to or detached from the interface board 331. Therefore, if a semiconductor device to be tested is changed, e.g., when electrode pads of a unit semiconductor device to be tested have a different arrangement structure, only the probe unit 340 in the probe card 300 may be replaced to correspond to the electrode pads of a different arrangement structure. In other words, the entire probe card 300 may not be replaced, e.g., the main circuit board 310 and the interface unit 330 may not be detachable and may remain stationary According to example embodiments, a probe unit may be detachable from the interface unit, so different arrangements of probe needles may be adjusted to correspond to electrode pads patterns of a semiconductor device to be tested. Therefore, a test apparatus according to example embodiments may require change of only the probe unit with the probe needles, as opposed to change of a whole probe card, in order to correspond to different arrangements of electrode pads in a semiconductor device to be tested. Thus, manufacturing time and costs of the probe card may be substantially decreased.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A probe card transmitting electrical test signals between a tester and semiconductor devices, the probe card comprising:

a main circuit board configured to receive and transmit electrical signals from the tester;

an interface unit electrically connected to the main circuit board, the interface unit including a signal line and a signal connection terminal; and a plurality of probe units connected to the interface unit, each probe unit being independently detachable, and each probe unit including a substrate and a plurality of probe needles arranged on the substrate in a pattern corresponding to a pattern of electrode pads of a semiconductor device of the semiconductor devices.

2. The probe card as claimed in claim 1, wherein the interface unit includes:

an interface board having a plate shape and disposed below the main circuit board, the interface board including first connection terminals on a top surface thereof and second connection terminals on a bottom surface thereof, the first and second connection terminals being electrically connected to each other; and an interposer electrically connecting the main circuit board and the first connection terminals.

3. The probe card as claimed in claim 2, wherein the first connection terminals are arranged in a lattice shape on the top surface of the interface board and the second connection terminals are symmetrically arranged along facing edges of the bottom surface of the interface board.

4. The probe card as claimed in claim 2, wherein each probe unit includes a plurality of holes through the substrate, the holes being filled with a conductive material, and the probe needles being on a bottom surface of the substrate and electrically connected to the conductive material in corresponding holes of the substrate.

5. The probe card as claimed in claim 4, wherein the holes of the substrate are arranged at positions corresponding to an arrangement of the second connection terminals.

6. The probe card as claimed in claim 4, wherein the holes of the substrate are arranged at positions corresponding to an arrangement of the probe needles.

7. The probe card as claimed in claim 4, wherein the substrate is attached to the interface board via solder balls, the solder balls being positioned between the second connection terminals and the conductive material in the holes.

8. The probe card as claimed in claim 4, further comprising a redistributed interconnection metal layer on the substrate, the redistributed interconnection metal layer electrically connecting the probe needles and the conductive material in the holes.

9. The probe card as claimed in claim 2, further comprising:

a reinforcement member contacting a top surface and a bottom surface of the main circuit board, the reinforcement member being configured to prevent deformation of the main circuit board; and an interface board support member on the reinforcement member, the interface board support member supporting the bottom surface of the interface board.

10. The probe card as claimed in claim 1, wherein the substrates of the plurality of probe units are on a same main circuit board and are spaced part from each other.

11. The probe card as claimed in claim 1, wherein the substrate of each probe unit is independently detachable from the interface unit.

12. The probe card as claimed in claim 11, wherein only a single surface of each substrate of each probe unit is connected to the main circuit board, the substrate of each probe unit being independently detachable via the single surface.

13. The probe card as claimed in claim 11, wherein the substrate of each probe unit is parallel to the interface unit and to the main circuit board.

14. The probe card as claimed in claim 1, wherein only a single surface of each probe unit is connected to the main circuit board.

15. The probe card as claimed in claim 1, wherein each probe unit is connected to the main circuit board only via the interface unit.

16. A probe card transmitting electrical test signals between a tester and semiconductor devices, the probe card comprising:

a main circuit board configured to receive and transmit electrical signals from the tester;

an interface unit electrically connected to the main circuit board, the interface unit including a signal line and a signal connection terminal; and a plurality of probe units connected to the interface unit, each probe unit being independently detachable, and each probe unit including a substrate and a plurality of probe needles arranged on the substrate in a pattern corresponding to a pattern of electrode pads of a semiconductor device of the semiconductor devices, wherein each probe unit of the plurality of probe units has a different arrangement of probe needles corresponding to a respective semiconductor device to be tested.

17. A test apparatus testing electrical characteristics of semiconductor devices, comprising:

a substrate support member to support a semiconductor substrate;

a tester configured to test electrical characteristics of the semiconductor device, the semiconductor device being on the semiconductor substrate; and a probe card configured to transmit electrical signals between the tester and the semiconductor device on the substrate, the probe card including:

a main circuit board configured to receive and transmit electrical signals from the tester, an interface unit electrically connected to the main circuit board, the interface unit including a signal line and a signal connection terminal, and a plurality of probe units connected to the interface unit, each probe unit being independently detachable, and each probe unit including a substrate and a plurality of probe needles arranged on the substrate in a pattern corresponding to a pattern of electrode pads of a semiconductor device of the semiconductor devices.

18. The test apparatus as claimed in claim 17, wherein the interface unit includes:

an interface board having a plate shape and disposed below the main circuit board, the interface board including first connection terminals on a top surface thereof and second connection terminals on a bottom surface thereof, the first and second connection terminals being electrically connected to each other; and an interposer electrically connecting the main board and the first connection terminals.

19. The test apparatus as claimed in claim 18, wherein each probe unit includes a plurality of holes through the substrate, the holes corresponding to the second connection terminals on the bottom surface of the interface board, the holes being filled with a conductive material, and the probe needles being on a bottom surface of the probe substrate and electrically connected to the conductive material in the holes.

20. The test apparatus as claimed in claim 19, wherein the probe substrate is connected to the interface board via solder balls, the solder balls being between the second connection terminals on the bottom surface of the interface board and the conductive material in the holes.

* * * * *